(12) United States Patent
Roufoogaran et al.

(10) Patent No.: US 8,600,315 B2
(45) Date of Patent: Dec. 3, 2013

(54) METHOD AND SYSTEM FOR A CONFIGURABLE FRONT END

(75) Inventors: Razieh Roufoogaran, Venice, CA (US); Iqbal Bhatti, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1609 days.

(21) Appl. No.: 11/754,467

(22) Filed: May 29, 2007

(65) Prior Publication Data

US 2012/0231752 A1    Sep. 13, 2012

Related U.S. Application Data

(60) Provisional application No. 60/895,698, filed on Mar. 19, 2007.

(51) Int. Cl.
  *H04B 1/44*    (2006.01)
(52) U.S. Cl.
  USPC ............ 455/78; 455/83; 455/127.3; 330/261; 330/285; 330/296
(58) Field of Classification Search
  None
  See application file for complete search history.

(56) References Cited

U.S. PATENT DOCUMENTS

| | | | |
|---|---|---|---|
| 5,059,922 A * | 10/1991 | Mahabadi | 330/264 |
| 5,554,865 A * | 9/1996 | Larson | 257/275 |
| 6,356,536 B1 * | 3/2002 | Repke | 370/282 |
| 6,414,562 B1 * | 7/2002 | Bouisse et al. | 333/32 |
| 6,738,601 B1 * | 5/2004 | Rofougaran et al. | 455/66.1 |
| 6,995,616 B2 * | 2/2006 | Behzad et al. | 330/311 |
| 7,120,411 B2 * | 10/2006 | Darabi | 455/240.1 |
| 7,339,415 B2 * | 3/2008 | Gaggl et al. | 327/537 |
| 7,421,255 B2 * | 9/2008 | Inamori et al. | 455/127.2 |
| 7,719,352 B2 * | 5/2010 | Kim et al. | 330/51 |
| 7,756,486 B1 * | 7/2010 | Tan et al. | 455/73 |
| 2004/0232982 A1 * | 11/2004 | Ichitsubo et al. | 330/129 |
| 2004/0253939 A1 * | 12/2004 | Castaneda et al. | 455/341 |
| 2005/0110558 A1 * | 5/2005 | Talwalkar et al. | 327/534 |
| 2005/0164667 A1 * | 7/2005 | Pan et al. | 455/291 |

* cited by examiner

*Primary Examiner* — Nay A Maung
*Assistant Examiner* — Alejandro Rivero
(74) *Attorney, Agent, or Firm* — Farjami & Farjami LLP

(57) ABSTRACT

Methods and systems for a configurable front end are disclosed. Aspects of one method may include a transceiver on a single chip that may comprise a power amplifier (PA) and a low noise amplifier (LNA). The PA may amplify signals to be transmitted over a range of output transmit power. An upper limit for a power range may of substantially 12 dBm. The LNA may be tolerant to PA signals by, for example, being configured to follow signal voltages generated from an output of the power amplifier. For example, each input transistor of the LNA may be isolated from other transistors in the LNA. Accordingly, the input transistors may float since they may not be tied to a voltage level via other transistors. This may allow the input transistors to avoid damage. The transceiver may also be configured for differential RF input, differential RF output, single-ended RF input, and/or single-ended RF output. In some configurations, the transceiver may also support use of a power amplifier external to the transceiver to amplify RF signals communicated by the transceiver.

22 Claims, 9 Drawing Sheets

US 8,600,315 B2

METHOD AND SYSTEM FOR A CONFIGURABLE FRONT END

CROSS-REFERENCE TO RELATED APPLICATIONS/INCORPORATION BY REFERENCE

This application makes reference to, claims priority to, and claims benefit of U.S. Provisional Application Ser. No. 60/895,698 filed Mar. 19, 2007.

This application also makes reference to U.S. patent application Ser. No. 11/754,472 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a configurable front end.

BACKGROUND OF THE INVENTION

In some conventional systems, a wireless system may broadcast radio frequency (RF) signals and receive RF signals. Generally, RF signals are transmitted at higher power levels than power levels of RF signals received at an antenna. The RF signals to be transmitted may be amplified to a desired power level by a power amplifier before being communicated to a transmit antenna. These transmitted signals will attenuate with distance traveled so that a receive antenna that is farther away will generally receive a weaker signal than a receive antenna that is closer. Typically, the received signals may not be able to be processed without being amplified.

Accordingly, the received RF signals may be amplified by a low-noise amplifier (LNA) before further processing the signals. For example, the RF signals may be downconverted to a lower frequency and/or demodulated, by the receiver portion of the wireless system. The LNAs may be designed to minimize addition of noise to the received RF signals since the signal-to-noise level may be very low.

However, since the LNAs may be adversely affected by the power levels generated by the power amplifiers, the LNAs and power amplifiers may be placed on separate chips. This may increase the chip count for a system, resulting in additional parts, larger printed circuit board layout real estate, and more complex trace routing.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a configurable front end, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a configurable front end. Aspects of the method may comprise a single transceiver chip that may comprise a transmitter portion and a receiver portion. The transmitter may comprise a power amplifier that may amplify signals to be transmitted over a range of output transmit power. The power amplifier may transmit, for example, at a low power transmit mode and a high power transmit mode. In the high power transmit mode, the power amplifier may output signals whose voltages may exceed a breakdown voltage for in put transistors of a low noise amplifier (LNA) that may be coupled to the power amplifier. An upper power limit for the low power transmit mode may be, for example, substantially 5 dBm. An upper power limit for the high power transmit mode may be, for example, substantially 12 dBm.

The receiver portion may comprise a low noise amplifier (LNA) that may amplify received RF signals, wherein the LNA may be tolerant to the power output from the power amplifier whether the power amplifier is operating in a low power transmit mode or a high power transmit mode. That is, the LNA may be tolerant to, or not damaged by, signals generated by the power amplifier. The LNA may be made tolerant to the power amplifier signals by being configured, for example, to follow signal voltages generated from an output of the power amplifier. Each input transistor of the LNA may be isolated from other transistors in the LNA. Accordingly, the input transistors may float since they may not be tied at the drain and/or source terminals to a voltage level via other transistors. This may allow the input transistors to avoid damage.

The transceiver may be configured for differential RF input, differential RF output, single-ended RF input, and/or single-ended RF output. In some configurations, the transceiver may support use of a power amplifier external to the transceiver to amplify RF signals communicated by the transceiver. The transceiver may also provide impedance matching for RF signals received from off-chip and for RF signals to be transmitted. The transceiver may also provide impedance matching to compensate for disabled circuitry in the transceiver. The transceiver may further comprise other parts, such as, for example, switches and capacitors, that may be made robust to tolerate higher output powers generated in a high power transmit mode.

Figure 1:
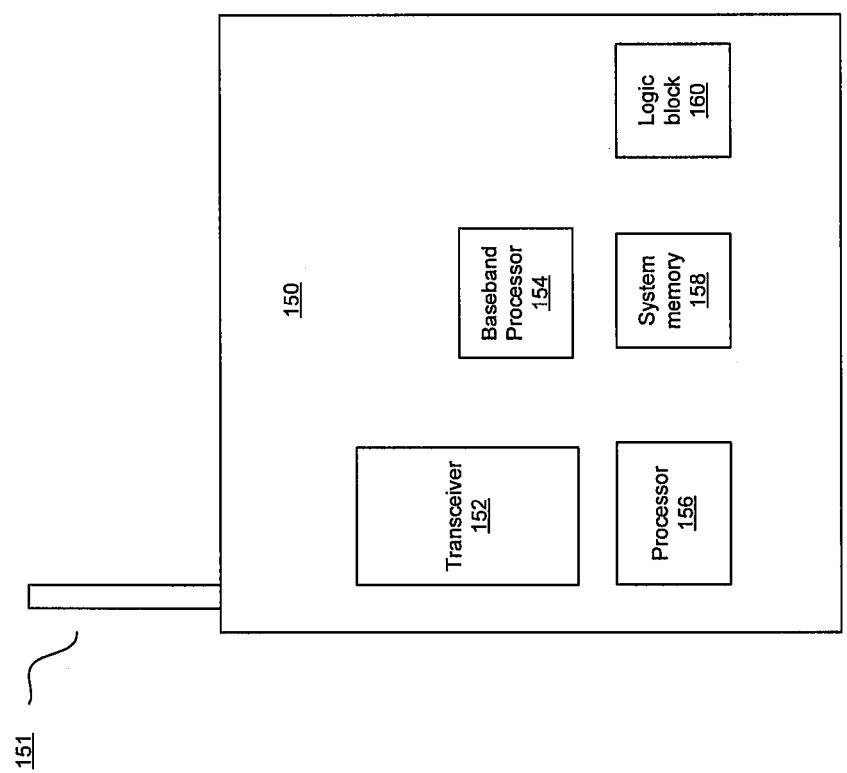
FIG. 1 is a block diagram of an exemplary wireless system, which may be utilized in connection with an embodiment of the invention.

FIG. 1 is a block diagram of an exemplary wireless system, which may be utilized in connection with an embodiment of the invention. Referring to FIG. 1, the wireless system 150 may comprise an antenna 151, a transceiver 152, a baseband processor 154, a processor 156, a system memory 158, and a logic block 160. The antenna 151 may be used for reception and/or transmission of RF signals. The transceiver 152 may comprise suitable logic, circuitry, and/or code that may be adapted to modulate and upconvert baseband signals to RF signals for transmission by one or more antennas, which may be represented generically by the antenna 151.

The transceiver 152 may also be adapted to downconvert and demodulate received RF signals to baseband signals. The RF signals may be received by one or more antennas, which may be represented generically by the antenna 151. Different wireless systems may use different antennas for transmission and reception. The transceiver 152 may be adapted to execute other functions, for example, filtering the baseband and/or RF signals, and/or amplifying the baseband and/or RF signals.

The baseband processor 154 may comprise suitable logic, circuitry, and/or code that may be adapted to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be adapted to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154.

Control and/or data information, which may comprise programmable parameters, may be transferred from other portions of the wireless system 150, which may not be shown, to the processor 156. Similarly, the processor 156 may be adapted to transfer control and/or data information, which may include the programmable parameters, to other portions of the wireless system 150, which may not be shown, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156. The system memory 158 may comprise suitable logic, circuitry, and/or code that may be adapted to store a plurality of control and/or data information, including parameters needed to calculate frequencies and/or gain, and/or the frequency value and/or gain value.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

Figure 2:
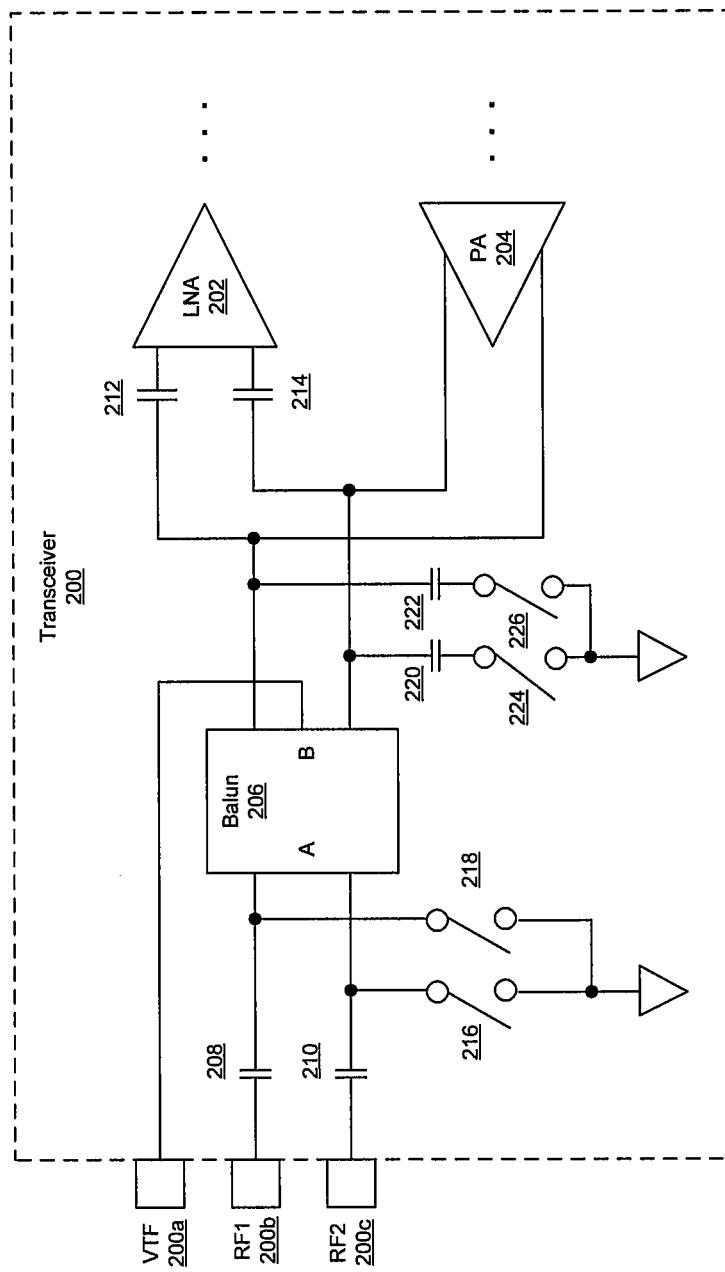
FIG. 2 is a block diagram illustrating an exemplary transceiver on a chip, in accordance with an embodiment of the invention.

FIG. 2 is a block diagram illustrating an exemplary transceiver on a chip, in accordance with an embodiment of the invention. Referring to FIG. 2, there is shown a transceiver 200, which may be similar in functionality to the transceiver 152. The transceiver 200 may be, for example, on a single chip. The transceiver 200 may comprise, in part, a low-noise amplifier (LNA) 202, a power amplifier 204, a balun block 206, capacitors 208, 210, 212, 214, 220, and 222, and switches 216, 218, 224, and 226. There is also shown chip I/O pads 200a, 200b, and 200c for input and output of signals.

The LNA 202 may comprise suitable logic and/or circuitry that may enable variable gain amplification of RF signals received by, for example, the wireless system 150. The LNA 202 may comprise a single-ended input or differential inputs, and may generate a single-ended output or differential output. The number of inputs and the number of outputs for the LNA 202 may be design and/or implementation dependent. The LNA 202 may be controlled by, for example, the baseband processor 154, the processor 156, and/or the logic block 160. The LNA 202 may also be designed to withstand high power levels output by the power amplifier 204. For example, when the LNA 202 is turned off, input signals may be received from the power amplifier 204.

The LNA 202 may allow input transistors to float so that the high power input signals may not cause gate-source and/or gate-drain voltages to exceed breakdown voltages. The LNA 202 is described with respect to FIG. 8. The design of LNA 202 that enables tolerance of high power levels is also described in more detail in U.S. patent application Ser. No. 11/754,472 filed on even date herewith, which is incorporated by reference in its entirety.

The power amplifier 204 may comprise suitable logic and/ or circuitry that may allow amplification of RF signals for transmission by the wireless system 150. The power amplifier 204 may be, for example, a variable gain amplifier where the output power may be grouped into a plurality of power ranges. For example, one power range may have an upper limit of 5 dBm, and another power range may have an upper limit of 12 dBm. For example, the power range with an upper limit of 5 dBm may be referred to as Class A, and the power range with an upper limit of 12 dBm may be referred to as Class B to distinguish the various ranges. The power amplifier 204 may comprise a single-ended input or differential inputs, and may generate a single-ended output or differential output. The number of inputs and the number of outputs for the power amplifier 204 may be design and/or implementation dependent. The balun block 206 may comprise suitable circuitry that may enable coupling RF signals from side A to side B of the balun block 206, and vice versa. The balun block 206 may provide, for example, impedance matching between circuitry on side A of the balun block 206 and circuitry on side B of the balun block 206.

The capacitors 208, 210, 212, and 214 may provide AC coupling for signals to and from side A of the balun block 206 and to the LNA 202, respectively. The switches 216 and 218 may be controlled by a processor in the wireless system 150, for example, the processor 156, to allow different transmission and/or reception configurations. The switches 216 and 218 may also be controlled, for example, by the baseband processor 154 and/or the logic block 160. Various exemplary configurations is described in more detail with respect to FIGS. 3A-6.

The capacitors 220 and 222 may be configured by the switches 224 and 226, respectively, as additional capacitive loads to be used as needed. For example, when the LNA 202 is turned off, the switches 224 and 226 may be closed to provide various compensating capacitive loads for the power amplifier 204. The switches 224 and 226 may be controlled similarly to the switches 216 and 218 by, for example, the processor 156, the baseband processor 154, and/or the logic block 160. In one embodiment of the invention, the switches 216 and 218 may be coupled to, for example, receiver circuitry ground plane used by the LNA 202, and the switches 224 and 226 may be coupled to, for example, power amplifier ground plane used by the power amplifier 204. The invention need not be so limited, however. Various embodiments of the invention may use other ground planes.

Various parts of the transceiver 200, such as, for example, the capacitors 212, 214, 216, and 218, and the switches 216, 218, 224, and 226 may also be optimized to tolerate the various output power levels generated by the power amplifier 204. Accordingly, the capacitors 212, 214, 216, and 218, and the switches 216, 218, 224, and 226 may be able to tolerate, for example, power levels of up to 12 dBm or more if the power amplifier 204 is able to generate output power levels of 12 dBm or more. An embodiment of the invention may use, for example, thick-oxide transistors to form the capacitors 212, 214, 216, and 218, and the switches 216, 218, 224, and 226, to avoid damage at power levels of, for example, up to 12 dBm. For example, if transistors on a chip are typically laid out using 0.13 micron technology, a thick-oxide transistor may be made using 0.25 micron transistor technology. The specific transistor technologies used may be design dependent.

In operation, a center tap for side B of the balun block 206 may be connected to an appropriate voltage for the output power desired via, for example, the chip I/O pad 200a. The chip I/O pad 200a may be connected to a voltage $V_{TF}$ that may be, for example, 1.5 volts for some power output levels. For example, power output levels of up to 5 dBm may use the voltage $V_{TF}$ of 1.5 volts. Higher power output levels may use the voltage $V_{TF}$ that may be, for example, 2.5 volts or 3.3 volts. The switches 216 and 218 may be opened or closed depending on whether an off-chip power amplifier (not shown for FIG. 2) is used, whether the transceiver 200 may be operating in a receive mode or a transmit mode, and whether differential mode may be used.

For example, a transmit mode that may utilize an off-chip power amplifier may use one of the chip I/O pads 200b and 200c to input received RF signals to the transceiver 200 and may use the other of the chip I/O pads 200b and 200c to output RF signals to be amplified by an off-chip power amplifier. Accordingly, the input and output RF signals at the chip interface may be single-ended via the chip I/O pads 200b and 200c. For another transmit mode that may not use an off-chip power amplifier, the power amplifier 204 may be used to output power of up to, for example, 5 dBm, or substantially 5 dBm. The transceiver 200 may be configured for use with higher output power, such as, for example, substantially 12 dBm. The output of the transceiver 200 at the chip interface may also be a single-ended output via the chip I/O pads 200b and 200c. The transceiver 200 may also be configured for differential input/output via the chip I/O pads 200b and 200c.

The received RF signals may be communicated from, for example, an antenna such as the antenna 151. While the antenna 151 may have been described as a single antenna, the invention need not be so limited. For example, the antenna 151 may comprise a plurality of antennas, and there may be separate antennas dedicated to transmission and to reception.

The exemplary upper power limits discussed, substantially 5 dBm and 12 dBm, may change with different embodiments of the RF front end in the transceiver 200. For example, other embodiments of the invention may allow upper power limits of substantially 7 dBm and 15 dBm, or other power levels.

Figure 3A:
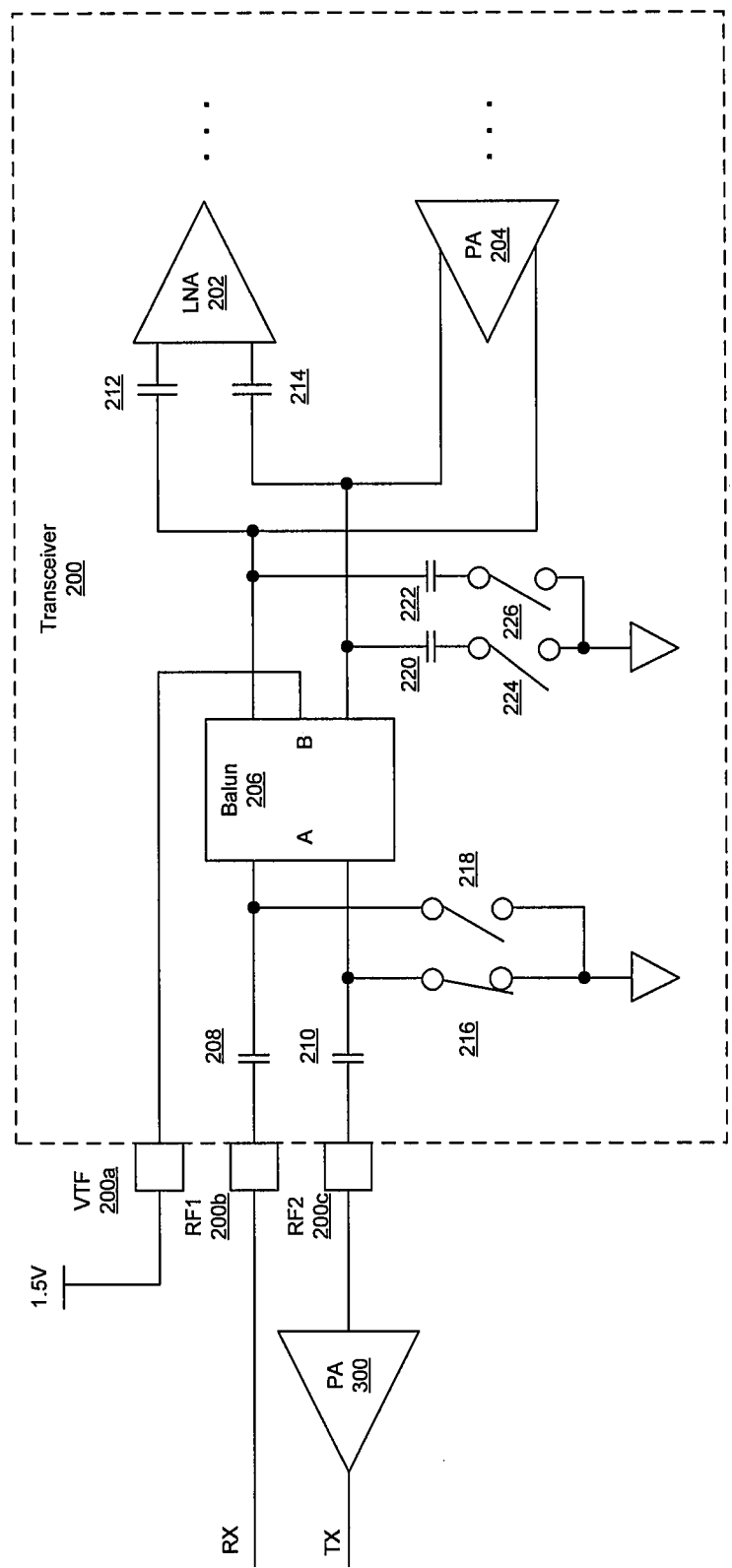
FIG. 3A is a block diagram illustrating an exemplary configuration of a transceiver on a chip, in accordance with an embodiment of the invention.

FIG. 3A is a block diagram illustrating an exemplary configuration of a transceiver on a chip, in accordance with an embodiment of the invention. Referring to FIG. 3A, there is shown the transceiver 200 in an exemplary configuration for a receive operation. The transceiver 200 may be configured for use with an off-chip power amplifier 300. Accordingly, the voltage $V_{TF}$ may be, for example, 1.5 volts and the LNA 202 may be turned on. The switch 216 may be closed and the switch 218 may be open. In this manner, the input to the off-chip power amplifier 300 may be grounded, while the received RF signals may be communicated to the transceiver 200. Additionally, during the receive mode, the inputs to the power amplifier 204 may be at a very low power level, if not ground level. Accordingly, the power amplifier 204 may generate very little, if any, RF signals that may interfere with the operation of the LNA 202. Other embodiments of the invention may comprise a power amplifier 204 that may be turned off.

The received RF signals may be communicated to side A of the balun block 206 via, for example, the chip I/O pad 200b. The differential RF output signals from side B of the balun block 206 may be communicated to the LNA 202. The LNA 202 may be turned on to amplify the received RF signals. The output of the LNA 202 may be further amplified, filtered, downconverted, and/or demodulated to a baseband signal. The baseband signal may then be communicated to the baseband processor 154 for further processing.

Figure 3B:
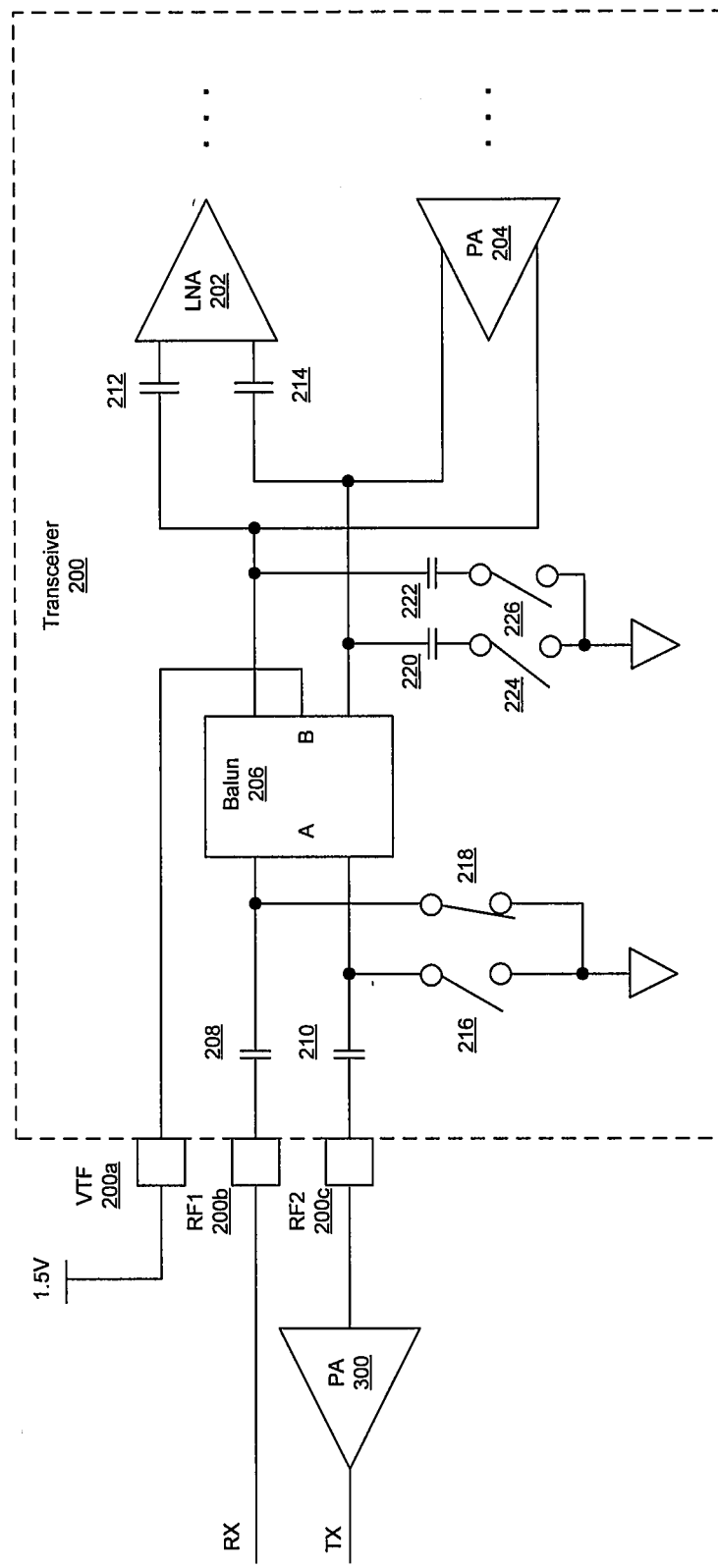
FIG. 3B is a block diagram illustrating an exemplary configuration of a transceiver on a chip, in accordance with an embodiment of the invention.

FIG. 3B is a block diagram illustrating an exemplary configuration of a transceiver on a chip, in accordance with an embodiment of the invention. Referring to FIG. 3A, there is shown the transceiver 200 in an exemplary configuration for a transmit mode. The transceiver 200 may be configured for use with the off-chip power amplifier 300. The voltage $V_{TF}$ may be, for example, 1.5 volts for transmit power of up to, for example, substantially 5 dBm. The output power level of the transceiver 200 may depend, for example, on input and amplifying specifications of the off-chip power amplifier 300. The LNA 202 may be turned off since the transceiver 200 may be in a transmit mode. The switch 216 may be open and the switch 218 may be closed. In this manner, the input to the off-chip power amplifier 300 may be from the output of side A of the balun block 206. The received RF signals may be, for example, shorted to ground via the closed switch 218.

During the transmit mode, RF signals to be transmitted may be communicated to the inputs of the power amplifier 204. Accordingly, the power amplifier 204 may amplify RF signals, and the amplified RF signals may be communicated to the B side of the balun block 206. The RF signals may then be coupled to the A side of the balun block 206, and thus communicated to the off-chip power amplifier 300 via the chip I/O pad 200c. The output of the off-chip power amplifier 300 may be communicated to an antenna, for example, the antenna 151, for transmission.

Figure 4:
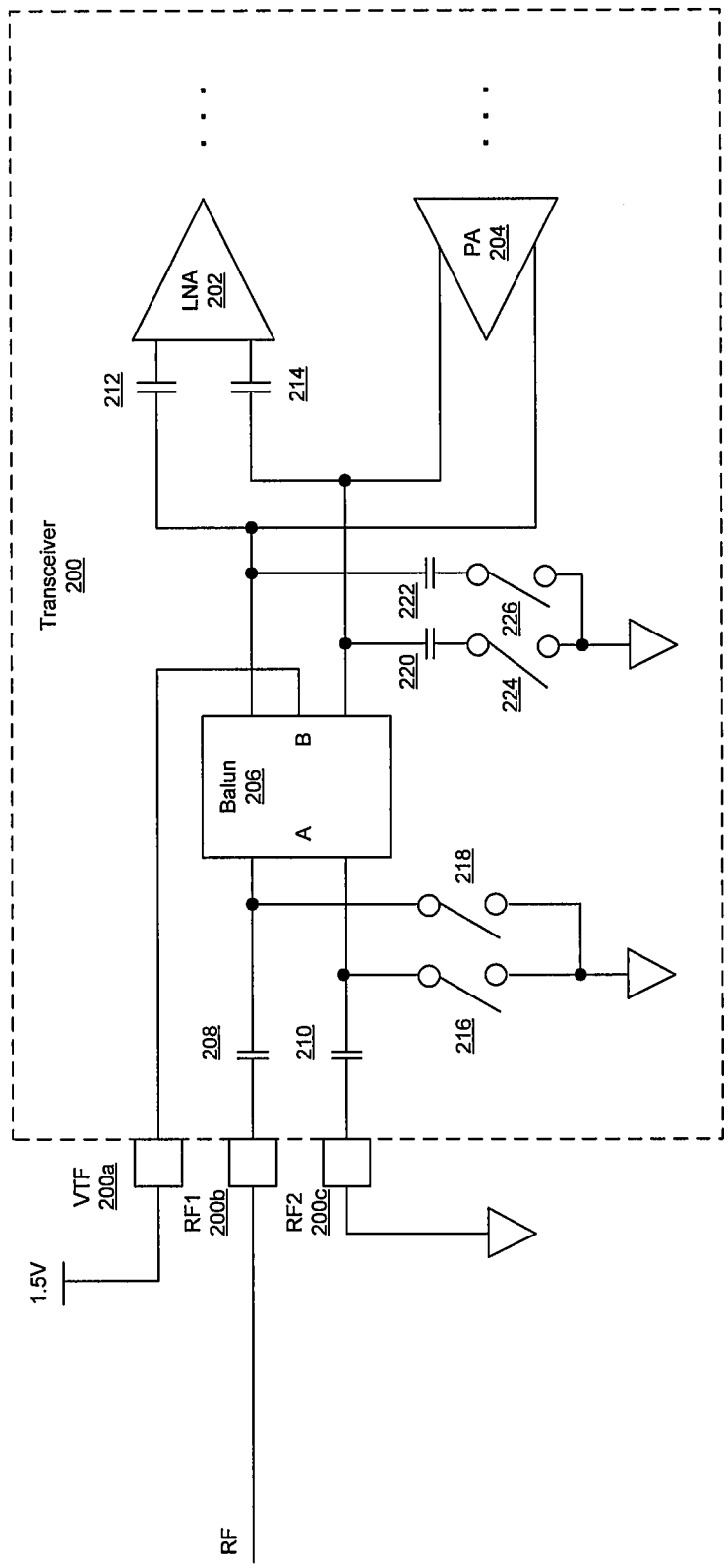
FIG. 4 is a block diagram illustrating an exemplary configuration of a transceiver on a chip, in accordance with an embodiment of the invention.

FIG. 4 is a block diagram illustrating an exemplary configuration of a transceiver on a chip, in accordance with an embodiment of the invention. Referring to FIG. 4, there is shown the transceiver 200 in an exemplary configuration for transmit and receive operations that may not use an off-chip power amplifier. In the transmit mode, the output power of the transceiver 200 may be up to, for example, substantially 5 dBm. Accordingly, the voltage $V_{TF}$ may be, for example, 1.5 volts. The LNA 202 may be turned off for single-ended transmit operation. The chip I/O pad 200b may be used, for example, to communicate RF signals to the antenna 151 for transmission. The chip I/O pad 200c may be, for example, coupled to ground.

The switches 216 and 218 may be open. In this manner, the RF signals to be transmitted may be communicated to the inputs of the power amplifier 204 where the RF signals may be amplified. The amplified RF signals may then be communicated to the B side of the balun block 206. The RF signals may be coupled to the A side of the balun block 206, and thus communicated to the chip I/O pad 200b. The RF signals may then be communicated to the antenna 151 for transmission.

In the receive mode, the RF signals may be received by the antenna 151 and the received RF signals may be communicated to the A side of the balun block 206 via the chip I/O pad 200b. The RF signals may be coupled to the LNA 202 via the B side of the balun block 206. The inputs to the power amplifier 204 may be at a very low power level, if not ground level. Accordingly, the power amplifier 204 may generate very little, if any, RF signals that may interfere with the operation of the LNA 202. Other embodiments of the invention may comprise a power amplifier 204 that may be turned off.

Figure 5:
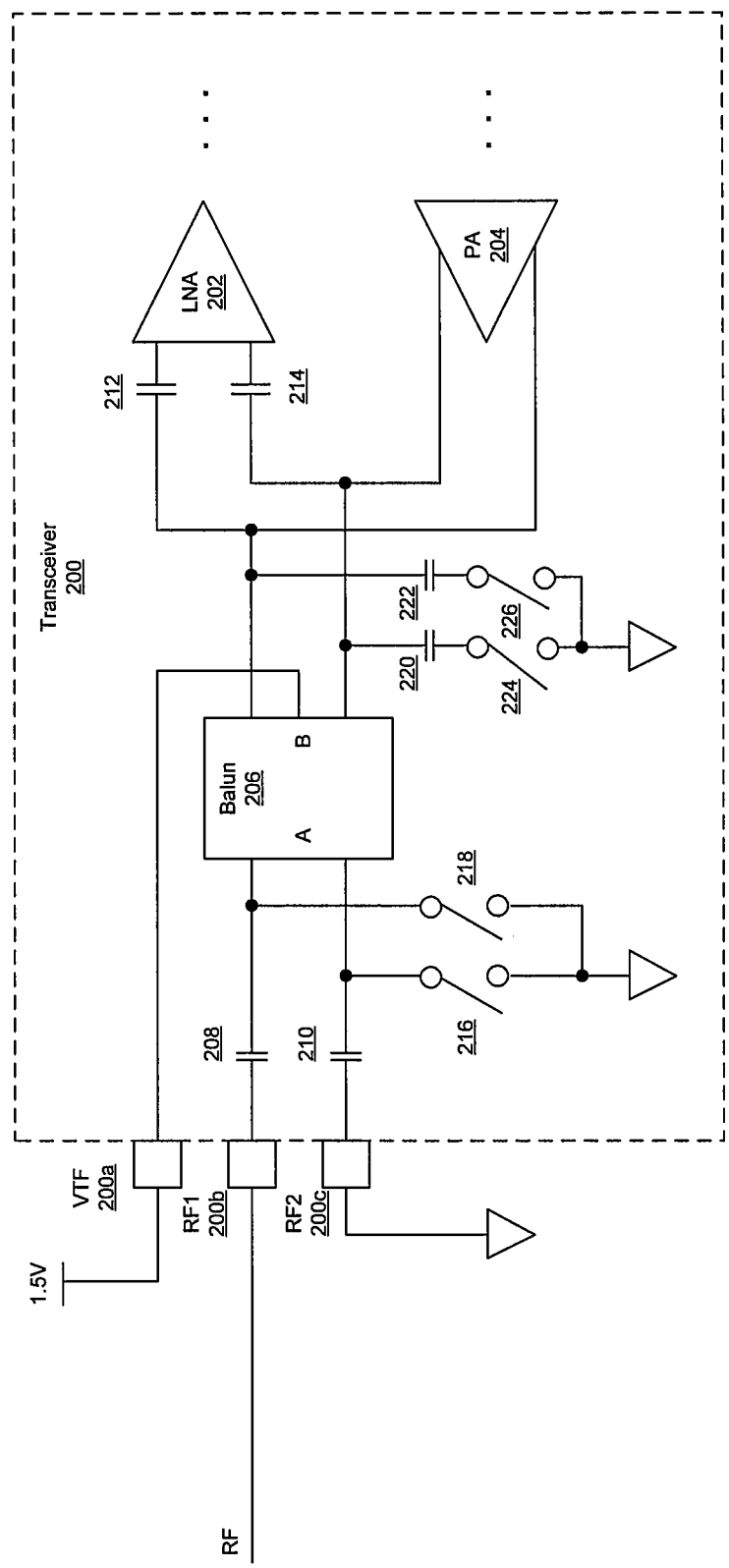
FIG. 5 is a block diagram illustrating an exemplary configuration of a transceiver on a chip, in accordance with an embodiment of the invention.

FIG. 5 is a block diagram illustrating an exemplary configuration of a transceiver on a chip, in accordance with an embodiment of the invention. Referring to FIG. 5, there is shown the transceiver 200 in an exemplary configuration for transmit and receive operations that may not use an off-chip power amplifier. In the transmit mode, the output power of the transceiver 200 may be up to, for example, substantially 12 dBm. Accordingly, the voltage $V_{TF}$ may be, for example, 2.5 volts or 3.3 volts for the higher power output from the power amplifier 204. The LNA 202 may be turned off for single-ended transmit operation. The chip I/O pad 200b may be used, for example, to communicate RF signals to the antenna 151 for transmission, and the chip I/O pad 200c may be, for example, coupled to ground.

The switches 216 and 218 may be open. In this manner, the RF signals to be transmitted may be communicated to the inputs of the power amplifier 204 where the RF signals may be amplified. The amplified RF signals may then be communicated to the B side of the balun block 206. The RF signals may be coupled to the A side of the balun block 206, and thus communicated to the chip I/O pad 200b. The RF signals may then be communicated to the antenna 151 for transmission. The LNA 202 may be designed to be protected from high output power, for example, of up to substantially 12 dBm at its input nodes.

In the receive mode, the RF signals may be received by the antenna 151 and the received RF signals may be communicated to the A side of the balun block 206 via the chip I/O pad 200b. The RF signals may be coupled to the LNA 202 via the B side of the balun block 206. The inputs to the power amplifier 204 may be at a very low power level, if not ground level. Accordingly, the power amplifier 204 may generate very little, if any, RF signals that may interfere with the operation of the LNA 202. Other embodiments of the invention may comprise a power amplifier 204 that may be turned off.

Figure 6:
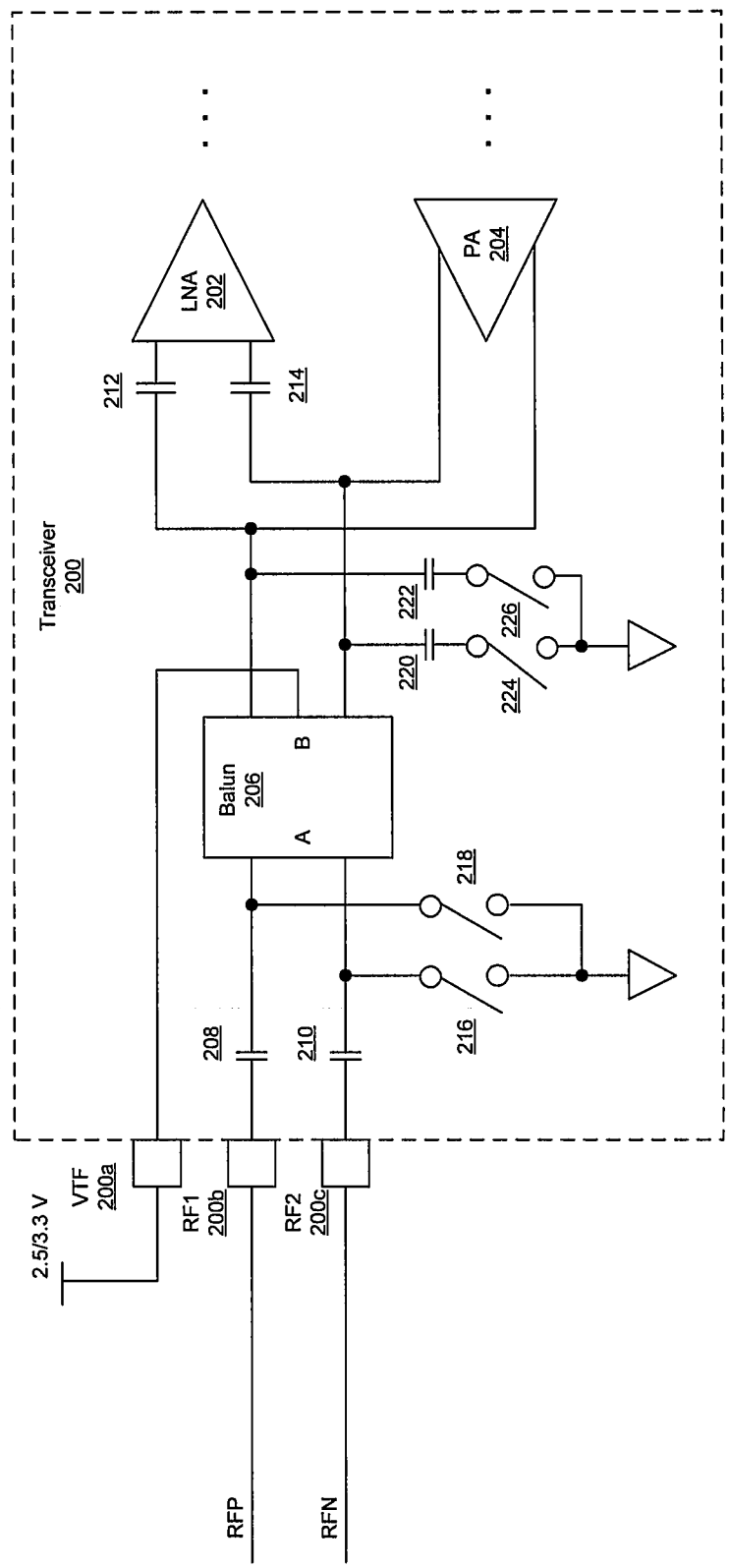
FIG. 6 is a block diagram illustrating an exemplary configuration of a transceiver on a chip, in accordance with an embodiment of the invention.

FIG. 6 is a block diagram illustrating an exemplary configuration of a transceiver on a chip, in accordance with an embodiment of the invention. Referring to FIG. 6, there is shown the transceiver 200 in an exemplary configuration for differential transmission and reception. The voltage $V_{TF}$ may be, for example, 1.5 volts. The switches 216 and 218 may be open. The LNA 202 may be turned off for transmit operations. The chip I/O pads 200b and 200c may be used to communicate differential RF signals externally to the chip with the transceiver 200. External circuitry (not shown) may be used to process the differential signals from the transceiver 200.

In this manner, the RF signals to be transmitted may be communicated to the inputs of the power amplifier 204 where the RF signals may be amplified. The amplified RF signals may then be communicated to the B side of the balun block 206. The RF signals may be coupled to the A side of the balun block 206, and thus communicated to the chip I/O pad 200b. The RF signals may then be communicated to the antenna 151 for transmission. The LNA 202 may be designed to be protected from high output power of up to, for example, substantially 12 dBm at its input nodes.

For receive operations, the LNA 202 may be turned on to amplify received RF signals. The chip I/O pads 200b and 200c may be used to receive differential RF signals to the transceiver 200. External circuitry (not shown) may be used to generate the differential RF signals from the RF signals received by the antenna 151. The differential RF signals may be communicated to the A side of the balun block 206, and the differential RF signals may be coupled to the B side of the balun block 206. The differential RF signals may then be communicated to the LNA 202.

Additionally, during the receive mode, the inputs to the power amplifier 204 may be at a very low power level, if not ground. Accordingly, the power amplifier 204 may generate very little, if any, RF signals that may interfere with the operation of the LNA 202. Other embodiments of the invention may comprise a power amplifier 204 that may be turned off.

Figure 7:
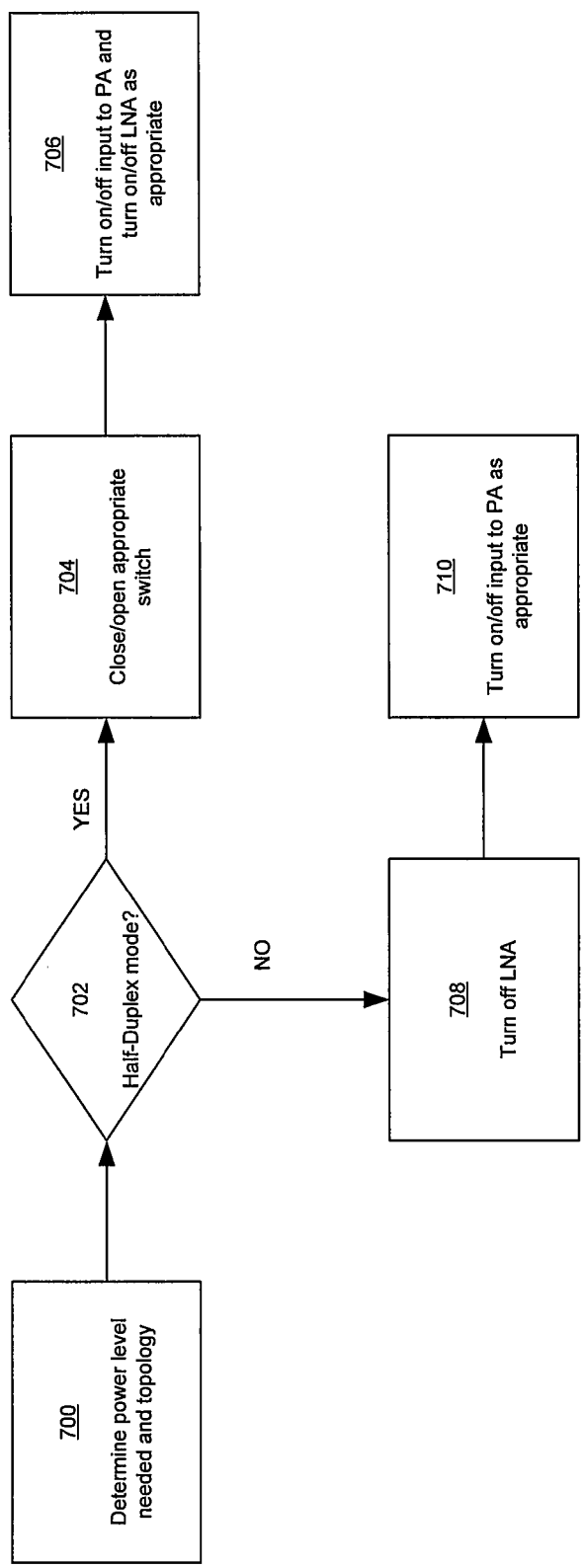
FIG. 7 is a flow diagram illustrating exemplary steps for using a transceiver on a chip, in accordance with an embodiment of the invention.

FIG. 7 is a flow diagram illustrating exemplary steps for using a transceiver on a chip, in accordance with an embodiment of the invention. Referring to FIG. 7, there is shown steps 700 to 710. In step 700, a determination may be made of the type of output power that the transceiver may be used for. For example, the determination may be made when the single chip transceiver 200 is used in a design for a mobile terminal. The output power level desired, and whether signals to and from the single chip transceiver 200 may be differential, may be used to configure the single chip transceiver 200. Then depending on the output power desired, an appropriate voltage $V_{TF}$ may need to be applied to, for example, the chip I/O pad 200a. For example, the voltage $V_{TF}$ may be 1.5 volts, 2.5 volts, or 3.3 volts. Additionally, the chip I/O pads 200b and 200c may be coupled appropriately, as described with respect to FIGS. 3A-6.

In step 702, a determination may he made as to whether the single chip transceiver 200 may need to operate in a half-duplex mode, or if the single chip transceiver 200 may only transmit. If the single chip transceiver 200 is to operate in a half-duplex mode, the next step may be step 704. Otherwise, the next step may be step 708. In step 704, the single chip transceiver 200 may be controlled by, for example, the baseband processor 154, the processor 156, and/or the logic block 160, to enable the switches 216, 218, 224 and 226 to be in open states or closed states, as needed. In step 706, the LNA 202 may be turned on for a receive operation and off for a transmit operation. Similarly, the input signals to the power amplifier 204 may be turned off for a receive operation and on for a transmit operation. In step 708, if the single chip transceiver 200 is to transmit only, the LNA 202 may be turned off. In step 710, the input signals to the power amplifier 204 may be turned off for receive operations and on for transmit operations.

While the LNA 202 may have been described as being protected for signals at its input nodes of as high as 12 dBm for exemplary purposes, the invention need not be so limited. For example, the LNA 202 may be designed to protect at power levels higher than 12 dBm. Additionally, while the power amplifier 204 may have been described as outputting power levels of up to 5 dBm and 12 dBm, the invention need not be so limited. These levels have been chosen for exemplary purposes. Various power ranges that may be output by the power amplifier 204 may be design dependent.

Figure 8:
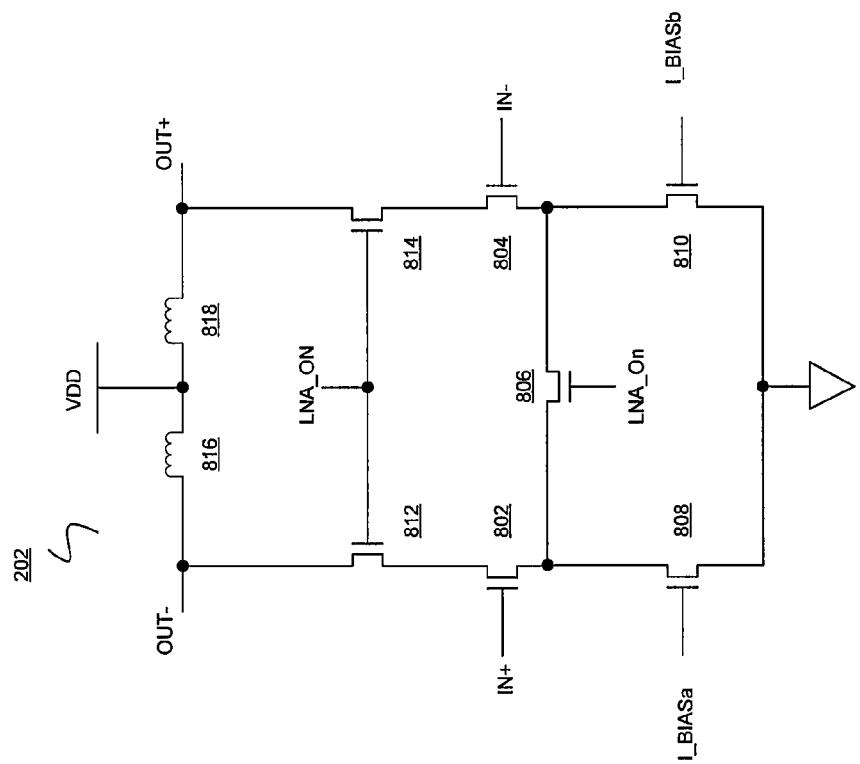
FIG. 8 is a circuit diagram illustrating an exemplary low noise amplifier, in accordance with an embodiment of the invention.

FIG. 8 is a circuit diagram illustrating an exemplary low noise amplifier, in accordance with an embodiment of the invention. Referring to FIG. 4, there is shown an exemplary circuit for a simplified LNA circuit. The simplified LNA circuit may be, for example, the LNA 202, which may comprise transistors 802, 804, 806, 808, 810, 812, and 814, and inductors 816 and 818. The transistors 802 and 804 may be, for example, input transistors that receive input signals IN+ and IN−. The transistors 808 and 810 may be, for example, individual current sources that may operate separately or form a single current source.

The transistor 806 may be a transistor that may be configured as a single current source from the transistors 808 and 810. The transistors 812 and 814 may amplify the input signals IN+ and IN− to generate the output signals OUT− and OUT+, respectively. The inductors 816 and 818 may be used, for example, to reduce the RF output signals OUT+ and OUT− from coupling to the supply voltage VDD.

The gates of the transistors 806, 812, and 814 may be communicated a control signal LNA_ON, where the control signal LNA_ON may be asserted when the LNA 202 is turned on. The control signal LNA_ON may be generated, for example, by the baseband processor 154, the processor 156, and/or the logic block 160. The transistors 808 and 810 may be biased by the biasing voltages I_BIASa and I_BIASb, where the biasing voltages I_BIASa and I_BIASb may be generated independently for each transistor 808 and 810, or the biasing voltages I_BIASa and I_BIASb may be the same voltage. The biasing voltages I_BIASa and I_BIASb may be generated, for example, by the baseband processor 154 and/or the logic block 160. The biasing voltages I_BIASa and I_BIASb may be reduced to turn off the transistors 808 and 810 when the control signal LNA_ON is deasserted.

In operation, the control signal LNA_ON may be asserted, for example, for a receive operation by the transceiver 200. Accordingly, the transistor 806 may be turned on, thereby shorting the source terminals of the transistors 802 and 804. Accordingly, the transistors 808 and 810 may form a single current source. Additionally, the transistors 812 and 814 may be turned on by the control signal LNA_ON, thereby allowing amplification of the input signals IN+ and IN−. The amplified signals may be the signals OUT− and OUT+ at the drain terminals of the transistors 812 and 814, respectively.

When the control signal LNA_ON is deasserted, the transistors 806, 808, 810, 812 and 814 may be turned off. Accordingly, the transistors 802 and 804 may float since they may not be tied to a voltage level via other transistors. Therefore, the voltages associated with the input signals IN+ and IN− may be coupled to the drain and source terminals of the transistors 802 and 804. Since the gate, drain and source terminals of the transistor 802 may be at similar voltages, there may not be adverse effects to the transistor 802 from the voltage levels due to the signal IN+. Similarly, there may not be adverse effects to the transistor 804 from the voltage levels due to the signal IN− since the gate, drain and source terminals of the transistor 804 may be at similar voltages.

While a specific LNA 202 may have been described, the invention need not be so limited. For example, various embodiments of the invention may comprise designs for the LNA 202 that may allow variable gain using other transistor circuits. The transistor circuits may then be controlled, for example, with the control signal LNA_ON, to turn off the transistors that may be coupled to the transistors 802 and 804 when the LNA is turned off. This may allow the transistors 802 and 804 to float as described above.

In accordance with an embodiment of the invention, aspects of an exemplary system may comprise the transceiver 200, where the transceiver 200 may comprise a receiver portion and a transmitter portion in a single chip. The power amplifier 204 in the transmitter portion of the transceiver 200 may amplify signals to be transmitted over a range of output transmit power. The power amplifier may, for example, operate in a high power transmit mode or a low power transmit mode. In the high power transmit mode, the power amplifier 204 may output voltage that is greater than a breakdown voltage for the input transistors 802 and 804 of the LNA 202. For example, an upper power limit for the low power transmit mode may be substantially 5 dBm. An upper power limit for the high power transmit mode may be, for example, substantially 12 dBm.

The receiver portion of the transceiver 200 may comprise the LNA 202, where the LNA 202 may be tolerant to the power output from the power amplifier 204 in the low power transmit mode and the high power transmit mode. That is, the LNA 202 may not be damaged by the power output from the power amplifier 204. The LNA 202 may be tolerant to power amplifier 204 signals by, for example, being configured to follow signal voltages generated from an output of the power amplifier 204. For example, each input transistor 802 and 804 may be isolated from other transistors in the LNA 202. Accordingly, the input transistors 802 and 804 may float since they may not be tied to a voltage level via other transistors. This may allow the input transistors 802 and 804 to avoid damage.

The transceiver 200 may be configured for differential RF input, differential RF output, single-ended RF input and/or single-ended RF output. The transceiver 200 may support a power amplifier external to the transceiver 200 to amplify RF signals communicated by the transceiver 200. The transceiver 200 may also comprise the balun 206 for impedance matching RF signals received by the transceiver 200 and/or RF signals to be output by the transceiver 200. A center tap of the balun 206 may be coupled to, for example, one of a plurality of voltages for different power transmit modes. For example, for a low power transmit mode, 1.5 volts may be coupled to the center tap, while for a high power transmit mode, 2.5 volts or 3.3 volts may be coupled to the center tap.

The transceiver 200 may further comprise the capacitive loads 220 and 222 that may be used to compensate for disabled circuitry. For example, the capacitive loads 220 and 222 may be configured to provide additional capacitive loads when the LNA 202 is turned off. Various portions of the transceiver 200 that may be exposed to the higher power levels generated by the high power transmit mode may be made more robust to withstand the higher power levels. For example, thick-oxide transistors may be used to form the capacitors 212, 214, 216, and 218, and the switches 216, 218, 224, and 226.

Another embodiment of the invention may provide a machine-readable storage, having stored thereon, a computer program having at least one code section executable by a machine, thereby causing the machine to perform the steps as described above for a configurable front end.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for processing signals, the method comprising:
   in a single transceiver chip comprising an integrated transmitter and a receiver:
      amplifying RF signals via a power amplifier (PA) within said transmitter, wherein said PA supports a high power transmit mode and a low power transmit mode, and
      wherein in said high power transmit mode, said PA outputs voltage that exceeds a breakdown voltage of input transistors for a low noise amplifier (LNA) in said receiver; and
      tolerating by said LNA voltage output by said PA in said high power transmit mode and said low power transmit mode by floating each of said input transistors in said LNA while in said high power transmit mode and while in said low power transmit mode;
      wherein said single transceiver chip comprises capacitive loads that compensate for circuitry that is switched off in said single transceiver chip.

2. The method according to claim 1, wherein said PA generates an upper power limit of 5 dBm.

3. The method according to claim 1, wherein said PA generates an upper power limit of 12 dBm.

4. The method according to claim 1, comprising configuring said single transceiver chip for at least one of: differential RF input and differential RF output.

5. The method according to claim 1, comprising configuring said single transceiver chip for at least one of: single-ended RF input and single-ended RF output.

6. The method according to claim 1, wherein an output of said PA is amplified by an external PA coupled to said single transceiver chip.

7. The method according to claim 1, comprising impedance matching RF signals received from off-chip, in said single transceiver chip.

8. The method according to claim 1, comprising impedance matching RF signals to be transmitted, in said single transceiver chip.

9. The method according to claim 8, comprising biasing impedance matching circuitry used for said impedance matching with one of a plurality of voltages.

10. The method according to claim 1, comprising providing impedance matching for said single transceiver chip to compensate for the circuitry that is switched off.

11. The method according to claim 1, comprising switches and capacitors, in said single transceiver chip to tolerate output powers generated by said transmitter.

12. A system for processing signals, the system comprising:
   a single transceiver chip comprising an integrated transmitter and a receiver:
      wherein a power amplifier (PA) within said transmitter amplifies signals in one of: a high power transmit mode and a low power transmit mode, wherein in said high power transmit mode, voltage output by said PA exceeds a breakdown voltage of input transistors for a low noise amplifier (LNA) in said receiver; and
      wherein said LNA is tolerant to voltage output by said PA in said high power transmit mode and said low power transmit mode by floating each of said input transistors in said LNA while in said high power transmit mode and while in said low power transmit mode;
      wherein said single transceiver chip comprises capacitive loads that compensate for circuitry that is switched off in said single transceiver chip.

13. The system according to claim 12, wherein said PA generates an upper power limit of 5 dBm.

14. The system according to claim 12, wherein said PA generates an upper power limit of 12 dBm.

15. The system according to claim 12, wherein said single transceiver chip is configured for at least one of: differential RF input and differential RF output.

16. The system according to claim 12, wherein said single transceiver chip is configured for at least one of: single-ended RF input and single-ended RF output.

17. The system according to claim 12, wherein an output of said PA is amplified by an external PA coupled to said single transceiver chip.

18. The system according to claim 12, comprising a balun in said single transceiver chip that enables impedance matching for RF signals received from off-chip.

19. The system according to claim 12, comprising a balun in said single transceiver chip that enables impedance matching for RF signals to be transmitted.

20. The system according to claim 19, wherein said balun is coupled to one of a plurality of different voltages for said impedance matching.

21. The system according to claim 12, comprising capacitive loads in said single transceiver chip that are used to compensate for the circuitry that is switched off.

22. The system according to claim 12, wherein switches and capacitors in said single transceiver chip are fabricated using thick-oxide transistor technology to tolerate output powers generated in said high power transmit mode.

* * * * *